United States Patent
Wu et al.

(10) Patent No.: US 6,885,054 B1
(45) Date of Patent: Apr. 26, 2005

(54) THRESHOLD VOLTAGE STABILIZER, METHOD OF MANUFACTURING AND INTEGRATED CIRCUIT EMPLOYING THE SAME

(75) Inventors: Xiaoju Wu, Irving, TX (US); Pinghai Hao, Plano, TX (US); Imran M. Khan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/772,210

(22) Filed: Feb. 4, 2004

(51) Int. Cl.$^7$ .......................... H01L 27/108; H01L 29/94
(52) U.S. Cl. .......................... 257/299; 257/402; 257/901
(58) Field of Search .............................. 257/299, 402, 257/901

(56) References Cited

U.S. PATENT DOCUMENTS 5,894,145 A * 4/1999 Chen et al. .................. 257/296
6,507,235 B1 * 1/2003 Sher .............................. 327/534

* cited by examiner

Primary Examiner—David Nelms
Assistant Examiner—Tu-Tu Ho
(74) Attorney, Agent, or Firm—Peter K. McLarty; W. James Brady, III; Frederick J. Telecky, Jr.

(57) ABSTRACT

The present invention provides a threshold voltage stabilizer for use with a MOS transistor having a body effect associated therewith. In one embodiment, the threshold voltage stabilizer, includes a body well located in a substrate, a source located in the body well, and a stabilization region positioned below the body well. The threshold voltage stabilizer is configured to provide a stabilization voltage to the stabilization region to increase a depletion region within the body well and thereby restrict the body effect to stabilize a threshold voltage of the MOS transistor.

25 Claims, 8 Drawing Sheets

THRESHOLD VOLTAGE STABILIZER, METHOD OF MANUFACTURING AND INTEGRATED CIRCUIT EMPLOYING THE SAME

TECHNICAL FIELD OF THE INVENTION

The present invention is directed, in general, to integrated circuits and, more specifically, to a threshold voltage stabilizer, a method of manufacturing the threshold voltage stabilizer and an integrated circuit employing the stabilizer and method.

BACKGROUND OF THE INVENTION

Metal-oxide-semiconductor (MOS) transistors provide a basic building block that is employed in a wide variety of integrated circuit applications. The increase in MOS transistor densities, due to their shrinking footprint, have allowed their use in a broad spectrum of integrated circuits and systems. MOS transistors are formed on a substrate employing a body well containing source and drain regions that are positioned across a channel region. The channel region is located below a gate structure, which is used to control carrier concentrations within the channel region thereby forming either a conductive or a nonconductive channel between the source and drain. This control is provided by a gate voltage that is applied between the gate and source. As the gate voltage increases in the conductive direction, a threshold voltage is reached wherein the MOS transistor turns on and conducts a specified amount of drain current.

In many applications, the body well and the source of the MOS transistor are directly connected thereby providing a threshold voltage that is stable and therefore predictable. In other applications, the body well is biased with respect to the source and used in a manner that requires that there be a potential difference between them. This body well bias changes the operating parameters of the MOS transistor from its unbiased state. The effect of this body well bias (called a body effect) widens a gate depletion region. This in turn, raises the threshold voltage of the transistor, which is highly detrimental in low power supply applications. This is especially true in low power supply analog applications in which the threshold voltage consumes a substantial amount of headroom.

The magnitude of the body effect depends on the doping concentration of the body well, and the potential difference associated with the body well bias. However, these parameters are often directed by other process or application requirements and typically, may not be independently adjustable. Reducing the body effect is of particular importance in applications or process technologies where a low power supply is needed, higher breakdown voltage is limited and the source and body must not be connected together. One example of this situation is in a radio frequency identification (RFID) application, such as an RFID tag. The RFID tag employs an embedded EEPROM array that uses MOS transistors in its "select lines" that accommodate high values of erasing and programming voltages. Another example occurs in lower power supply analog applications, where a low threshold voltage is very beneficial to increasing the amount of signal swing headroom.

Accordingly, what is needed in the art is an effective way to overcome the variation of threshold voltage as it relates to body effect.

SUMMARY OF THE INVENTION

To address the above-discussed deficiencies of the prior art, the present invention provides a threshold voltage stabilizer for use with a MOS transistor having a body effect associated therewith. In one embodiment, the threshold voltage stabilizer, includes a body well located in a substrate, a source located in the body well, and a stabilization region positioned below the body well. The threshold voltage stabilizer is configured to provide a stabilization voltage to the stabilization region to increase a depletion region within the body well and thereby restrict the body effect to stabilize a threshold voltage of the MOS transistor.

In another embodiment, the present invention provides a method of manufacturing a threshold voltage stabilizer for use with a MOS transistor having a body effect associated therewith. The method includes the steps of forming a body well in a substrate, forming a source in the body well, creating a stabilization region wherein at least a portion of the stabilization region is located below the body well, and configuring the threshold voltage stabilizer to provide a stabilization voltage to the stabilization region to increase a depletion region within the body well and thereby restrict the body effect to stabilize a threshold voltage of the MOS transistor.

Additionally, the present invention provides an integrated circuit. The integrated circuit includes memory cells located on a semiconductor substrate, MOS transistors located on the semiconductor substrate that have a body effect associated therewith, and threshold voltage stabilizers located on the semiconductor substrate. The threshold voltage stabilizers are employed with the MOS transistors, which include a body well located in the semiconductor substrate, a source located in the body well, and a stabilization region positioned below the body well. The threshold voltage stabilizer provides a stabilization voltage to the stabilization region to increase a depletion region within the body well and thereby restrict the body effect to stabilize a threshold voltage of the MOS transistor. The integrated circuit further includes interconnects that connect the MOS transistors, memory cells and threshold voltage stabilizers to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1A:
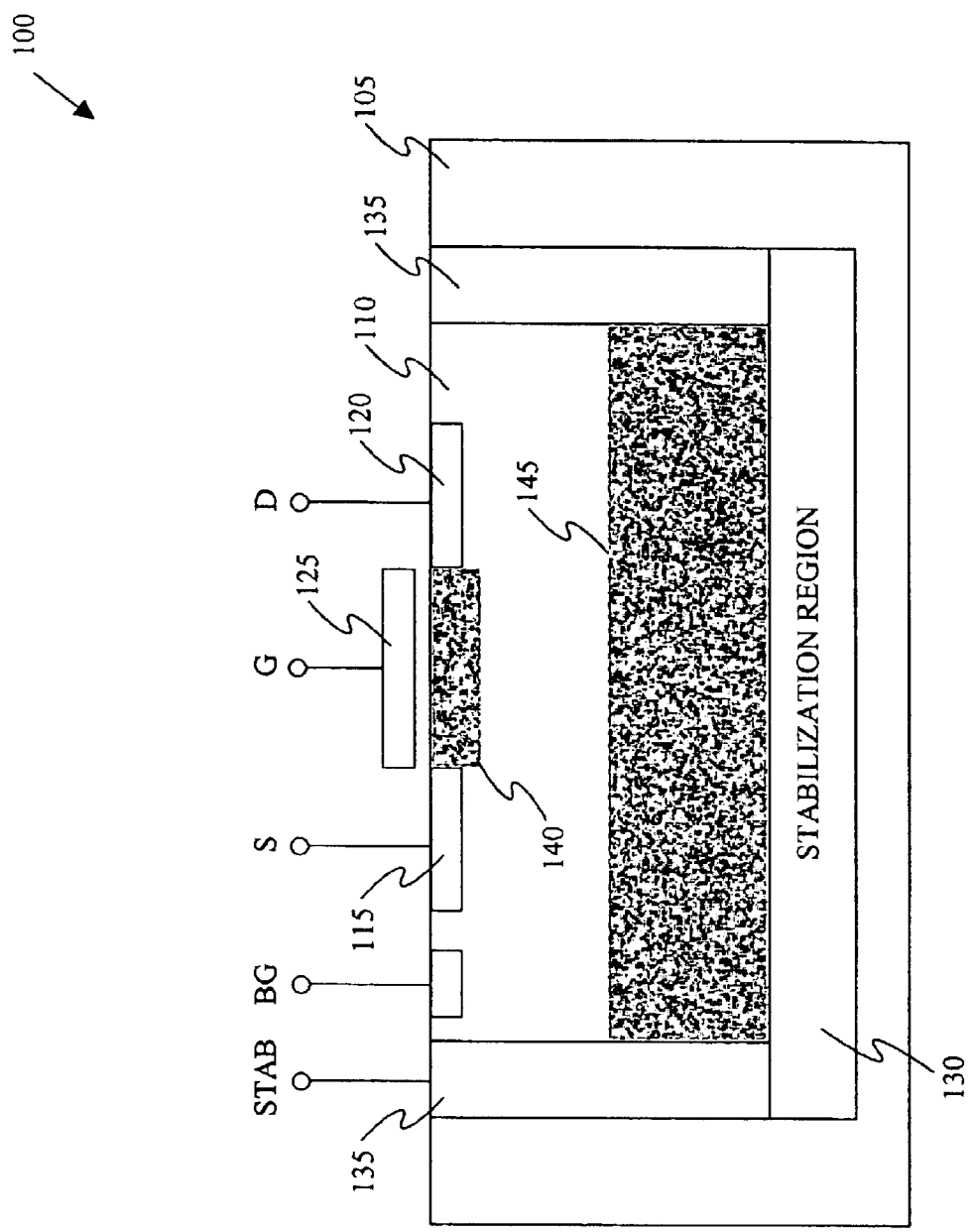
FIG. 1A illustrates a sectional view of an embodiment of a MOS transistor employing a stabilization region constructed in accordance with the principles of the present invention.

Referring initially to FIG. 1A, illustrated is a sectional view of an embodiment of a MOS transistor employing a stabilization region, generally designated 100, constructed in accordance with the principles of the present invention. The MOS transistor 100 exhibits a body effect during operation and includes a substrate 105, a body well 110 within the substrate 105 connected to a backgate terminal BG, a source 115 within the body well 110 connected to a source terminal S, a drain 120 within the body well 110 connected to a drain terminal D and a gate 125 connected to a gate terminal G. The MOS transistor 100 also includes a stabilization region 130, positioned below the body well 110, having contacting side or lateral stabilization regions 135 that are adjacent the body well 110 and connected to a stabilization terminal STAB. FIG. 1A also illustrates a regularly occurring channel depletion region 140 and a stabilization depletion region 145 within the body well 110.

In the illustrated embodiment, the body well 110 is not directly connected to the source 115. A backgate bias voltage may be applied between the body well 110 and the source 115 employing the backgate terminal BG and the source terminal S as may be determined by specific applications such as a MOS transmission gate and select transistor in an integrated EEPROM cell. This creates a body effect within the MOS transistor 100 that causes a threshold voltage of the MOS transistor 100 to vary as a function of the value of the applied backgate bias voltage. The stabilization region 130 forms a portion of a threshold voltage stabilizer wherein a stabilization voltage is provided to the stabilization region 130 via the stabilization terminal STAB and side stabilization regions 135. This stabilization voltage is independent of the backgate bias voltage that is applied to the body well 110 and causes the stabilization depletion region 145 to increase within the body well 110. This increase in the stabilization depletion region 145 limits expansion of the channel depletion region 140 within the body well 110 thereby resulting in stabilization of the threshold voltage of the MOS transistor 100.

As the backgate bias voltage increases, a larger value of stabilization voltage is required to stabilize the threshold voltage. Additionally, as the integrated dose (the Gummel number) of the body well increases with respect to the doping concentration of the stabilization region, a proportionally larger value of stabilization voltage is required to stabilize the threshold voltage. Threshold voltage stabilization occurs at the point where the upper edge of the stabilization depletion region 145 merges with the channel depletion region 140. The merging of these two depletion regions effectively stops the body effect and thus limits threshold voltage incrementation. Therefore, lower values of backgate bias voltage and doping ratios between the body well and stabilization region advantageously allow threshold voltage stabilization employing lower values of the stabilization voltage.

Figure 1B:
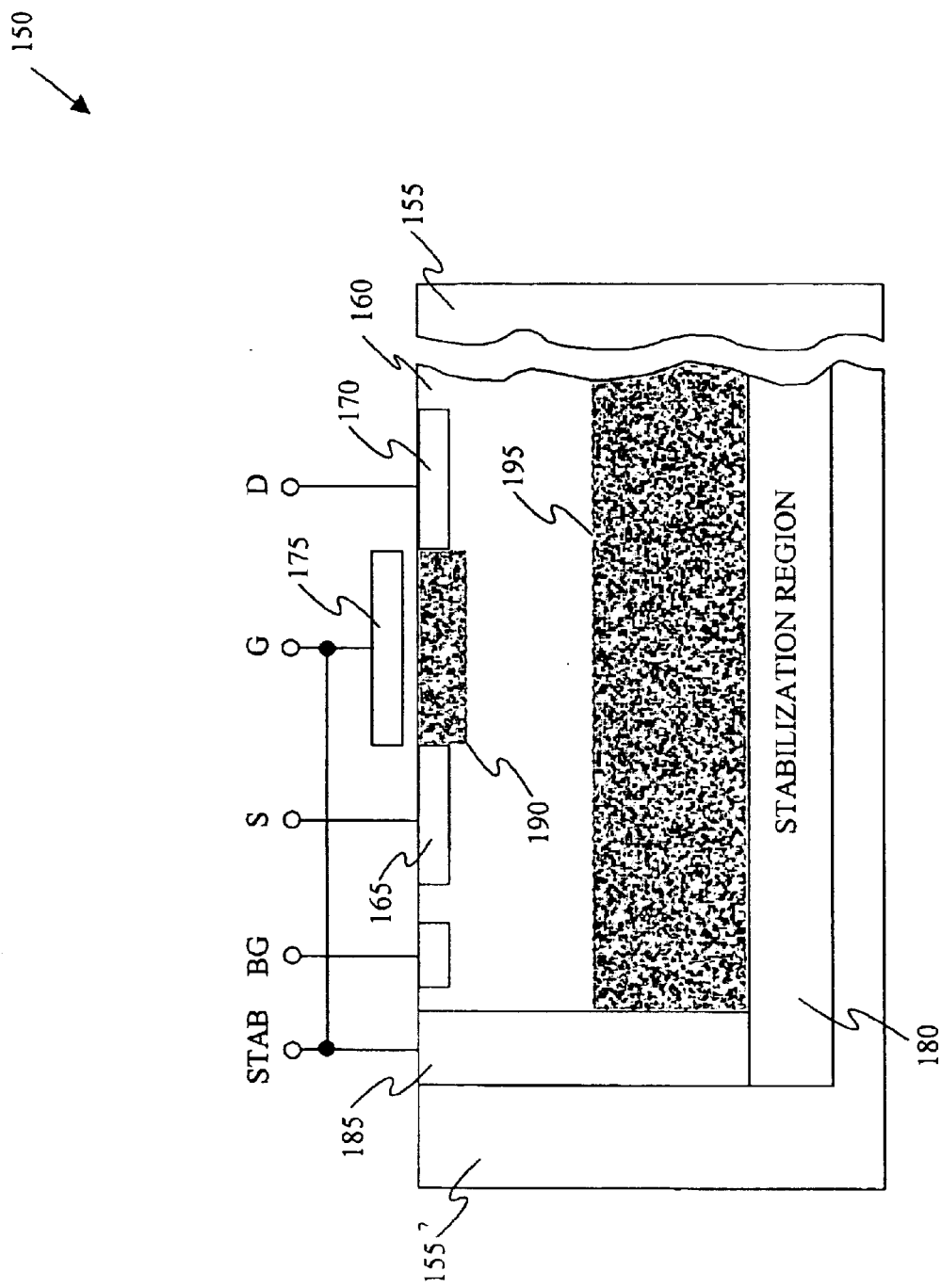
FIG. 1B illustrates a sectional view of an alternative embodiment of a MOS transistor employing a stabilization region constructed in accordance with the principles of the present invention.

Turning now to FIG. 1B, illustrated is a sectional view of an alternative embodiment of a MOS transistor employing a stabilization region, generally designated 150, constructed in accordance with the principles of the present invention. As with the MOS transistor 100, the MOS transistor 150 exhibits a body effect during operation and includes a substrate 155, a body well 160 within the substrate 155 connected to a backgate terminal BG, a source 165 within the body well 160 connected to a source terminal S, a drain 170 within the body well 160 connected to a drain terminal D and a gate 175 connected to a gate terminal G.

The MOS transistor 150 also includes a stabilization region 180 that is positioned below the body well 160 and has a single contacting side or lateral stabilization region 185, adjacent one side of the body well 160, which is connected to a stabilization terminal STAB. FIG. 1B also illustrates a regularly occurring channel depletion region 190 and a stabilization depletion region 195 within the body well 160. In the illustrated embodiment, the lateral stabilization region 185 differs from the lateral stabilization region 135 of FIG. 1A in that it is not a closed structure. The lateral stabilization region structure of FIG. 1B may be employed to save space associated with the topology of the MOS transistor 150. Additionally, it should be noted that the gate terminal G is electrically connected to the stabilization terminal STAB thereby affording another way of biasing a threshold voltage stabilizing structure to restrict the body effect and stabilize a threshold voltage associated with the MOS transistor 150.

Figure 2:
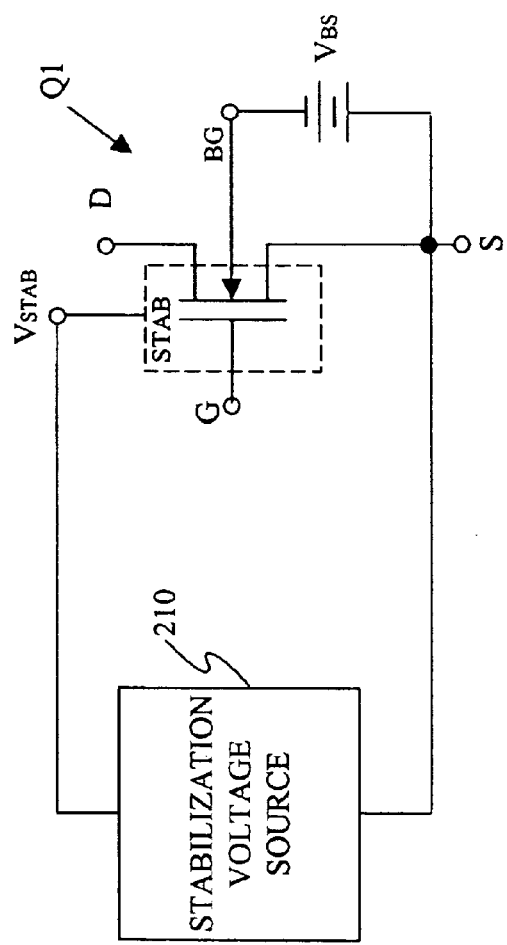
FIG. 2 illustrates a schematic representation of an embodiment of a threshold voltage stabilizer employable with a MOS transistor as shown in FIG. 1 and constructed in accordance with the principles of the present invention.

Turning now to FIG. 2, illustrated is a schematic representation of an embodiment of a threshold voltage stabilizer, generally designated 200, employable with a MOS transistor as shown in FIG. 1 and constructed in accordance with the principles of the present invention. The threshold voltage stabilizer 200 includes a threshold stabilized MOS transistor Q1 having a stabilization layer STAB and a stabilization voltage source 210 that provides a stabilization voltage $V_{STAB}$ to the stabilization layer STAB. The threshold stabilized MOS transistor Q1 includes a source S, a drain D, a gate G and a body well having a backgate terminal BG that is connected to a backgate bias voltage $V_{BS}$.

In the illustrated embodiment, the threshold stabilized MOS transistor Q1 employs the backgate bias voltage $V_{BS}$ in the form of a DC voltage, as shown. The stabilization voltage V$_{STAB}$ also provides a DC voltage that is sufficient to restrict (i.e., clamp) the body effect to a specific value thereby providing a stabilized value of threshold voltage. This threshold voltage effect will be further discussed with respect to FIG. 3.

In an alternative embodiment, the body well bias voltage V$_{BS}$ may be a voltage that varies with time (such as a gate or drain signal or another signal associated with the threshold stabilized MOS transistor Q1) as may be appropriate to its proper operation. The stabilization voltage V$_{STAB}$ may also be a variable voltage or time-varying (as may be appropriate to meet a breakdown voltage or another requirement) while acting to restrict the body effect and stabilize the threshold voltage. Additionally, the stabilization voltage source 210 may be connected to another point in the circuit, such as a common or ground reference point, instead of being tied directly to the source S, as shown.

Figures 3A, 3B:
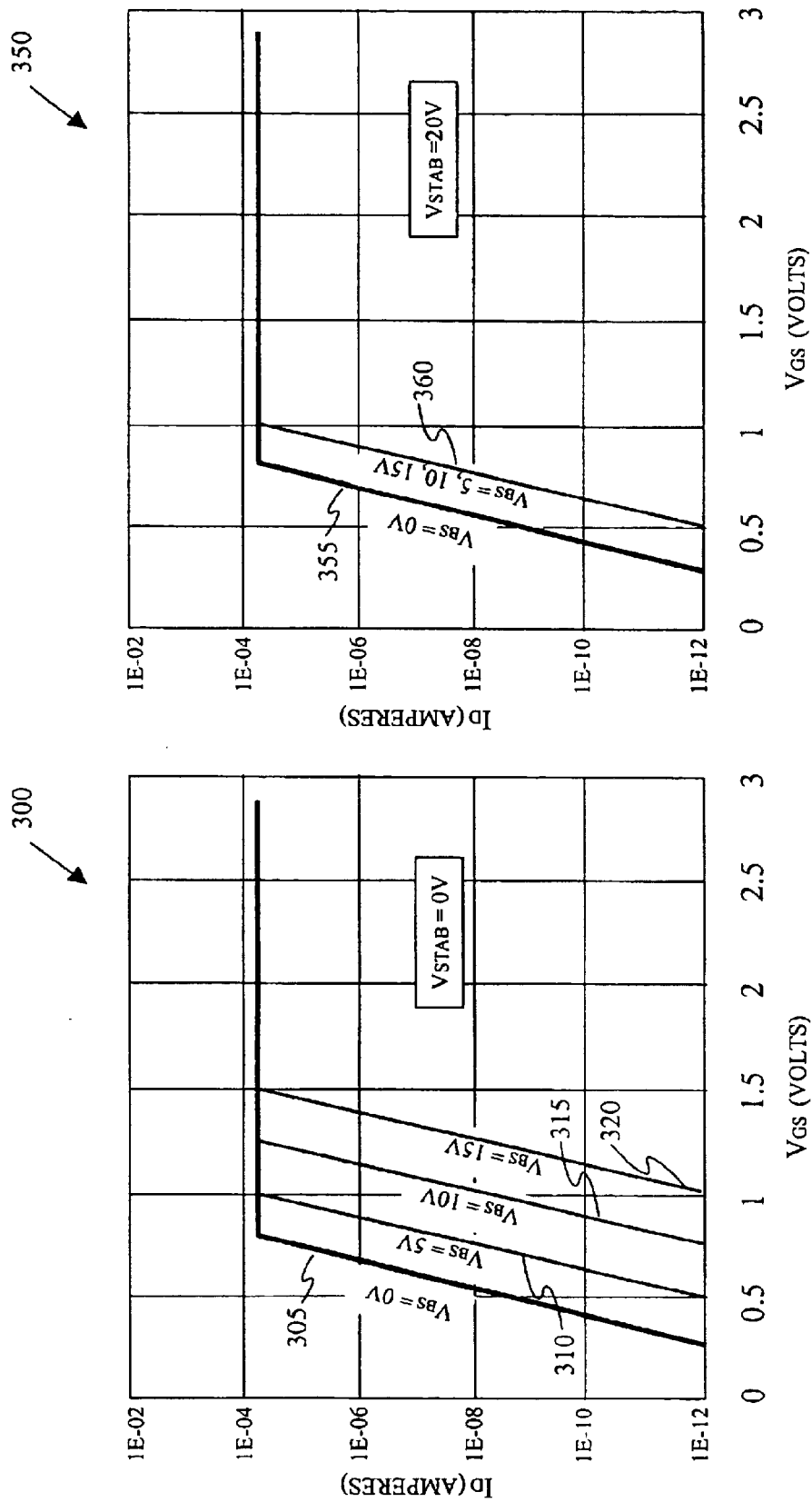
FIG. 3A illustrates a graph showing a variable threshold voltage as a function of backgate bias voltage while employing a zero value of stabilization voltage.
FIG. 3B illustrates another graph showing a stabilized threshold voltage as a function of backgate bias voltage while employing a non-zero value of stabilization voltage constructed in accordance with the principles of the present invention.

Turning now to FIG. 3A, illustrated is a graph, generally designated 300, showing a variable threshold voltage as a function of backgate bias voltage while employing a zero value of stabilization voltage. The graph 300 includes first, second, third and fourth threshold voltage curves 305, 310, 315, 320 employing differing values of backgate bias voltage V$_{BS}$. In the first curve 305, the backgate bias voltage V$_{BS}$ is zero thereby producing no body effect. This condition corresponds to a body well and source that are effectively connected together and yields the lowest value of threshold voltage. The second, third and fourth threshold voltage curves 310, 315, 320 illustrate increasing values of threshold voltage as the backgate bias voltage V$_{BS}$ is increased to 5 volts, 10 volts and 15 volts with respect to the source, thereby exhibiting a body effect.

Turning now to FIG. 3B, illustrated is another graph, generally designated 350, showing a stabilized threshold voltage as a function of backgate bias voltage while employing a non-zero value of stabilization voltage constructed in accordance with the principles of the present invention. The graph 350 includes first and second threshold voltage curves 355, 360. As discussed with respect to FIG. 3A, the first threshold voltage curve 355 employs a backgate bias voltage V$_{BS}$ that is zero thereby producing no body effect.

The second threshold voltage curve 360 illustrates the stabilizing influence of employing a stabilization voltage V$_{STAB}$ of 20 volts applied to a stabilization region in a threshold stabilized MOS transistor, as previously discussed. The second threshold voltage curve 360 illustrates that a substantially single threshold voltage is obtained for increasing values of the backgate bias voltage V$_{BS}$ of 5 volts, 10 volts and 15 volts with respect to the source. In general, the stabilization voltage V$_{STAB}$ required to stabilize the threshold voltage is a function of the Gummel number of the back gate. A large Gummel number requires a larger stabilization voltage to stop the channel depletion expansion. In addition, a higher stabilization region doping concentration also helps to reduce the requirement for stabilization voltage.

Figure 4A:
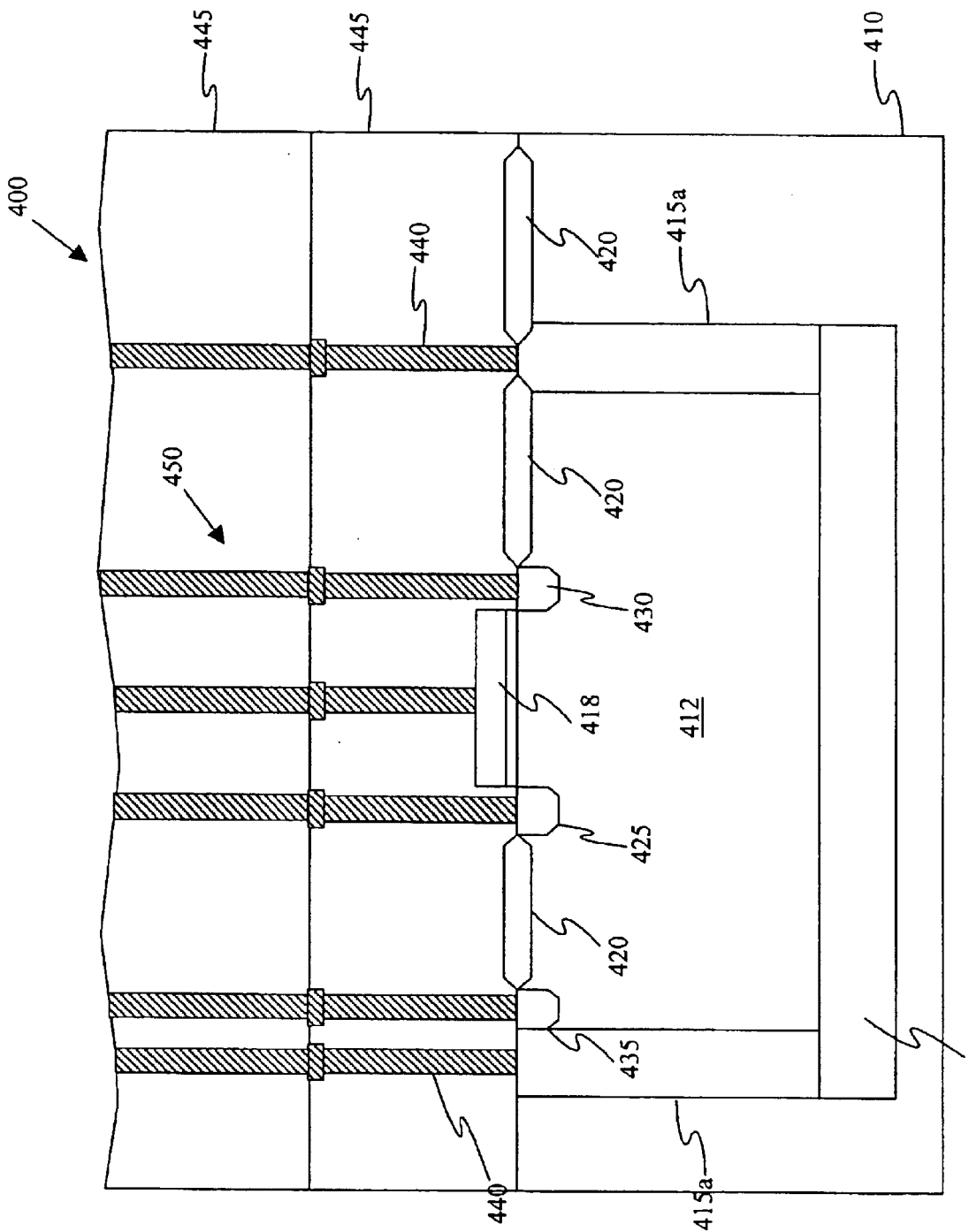
FIG. 4A illustrates a sectional view of an embodiment of a method of manufacturing a MOS transistor carried out in accordance with the principles of the present invention.

Turning now to FIG. 4A, illustrated is a sectional view of an embodiment of a MOS transistor, generally designated 400. The processes and materials used to construct the MOS transistor 400 are conventional. For example, a well or tank 412, which serves as the body well for the MOS transistor 400, is formed in an appropriate semiconductive substrate 410, such as p-typed doped silicon substrate. In one embodiment, the well 412 is doped to a concentration that ranges from about 5 E15/cm$^3$ to 5 E16/cm$^3$. An isolation region 415, which may be a doped buried layer, is also formed in the substrate 410 and is preferably doped with a dopant opposite that of the dopant in the well 412 to a concentration that ranges from about 5 E18/cm$^3$ to 2 E19/cm$^3$. It should be generally understood that the dopant schemes discussed herein may be reversed. In one embodiment, at least a portion of the isolation region 415 is located below the well 412, and in another embodiment, the isolation region 415 may also include side or lateral isolation regions 415a, which in this embodiment are located proximal a conventionally formed gate 418. The MOS transistor 400 also includes isolation structures 420, such as field oxide structures, source and drains 425, 430, a backgate contact area 435 and isolation region contacts 440.

Upon completion of the MOS transistors 400 at the device level, interlevel dielectrics 445 are conventionally deposited over the MOS transistor 400 and interconnects 450 are formed through and on the interlevel dielectric levels 445 that interconnect the various active devices to form an operative integrated circuit. One who is skilled in the art would understand how to form such interconnects.

Figure 4B:
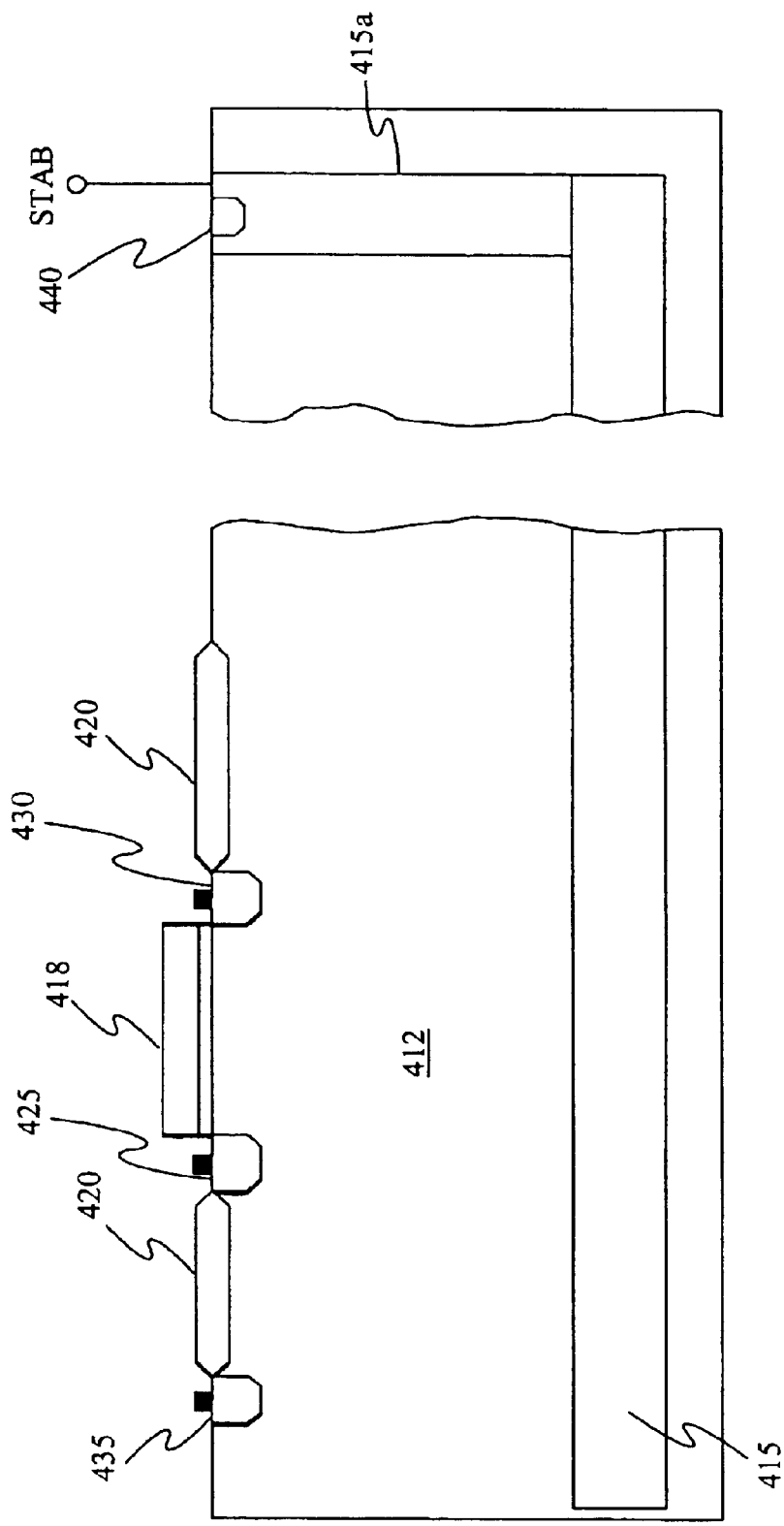
FIG. 4B illustrates a sectional view of an alternate embodiment of a method of manufacturing a MOS transistor carried out in accordance with the principles of the present invention.

Turning now to FIG. 4B, illustrated is a sectional view of an alternate embodiment the MOS transistor 400 illustrated in FIG. 4A. In this particular embodiment, the lateral isolation region 415a, may be located more distal from the gate 418. However, as shown, the lateral isolation region may still be used to increase the depletion region within the well 412 for the advantages discussed herein.

While the methods disclosed herein have been described and shown with reference to particular steps performed in a particular order, it will be understood that these steps may be combined, subdivided, or reordered to form an equivalent method without departing from the teachings of the present invention. Accordingly, unless specifically indicated herein, the order and/or the grouping of the steps are not limitations of the present invention. However, it should be noted that whatever conventional methods or materials are used to construct the MOS transistor 400, the device is configured in such a way that a stabilization voltage can be applied to the isolation region 415 to increase a depletion region within the well 412 and thereby restrict the body effect and stabilize a threshold voltage of the MOS transistor 400.

Figure 5:
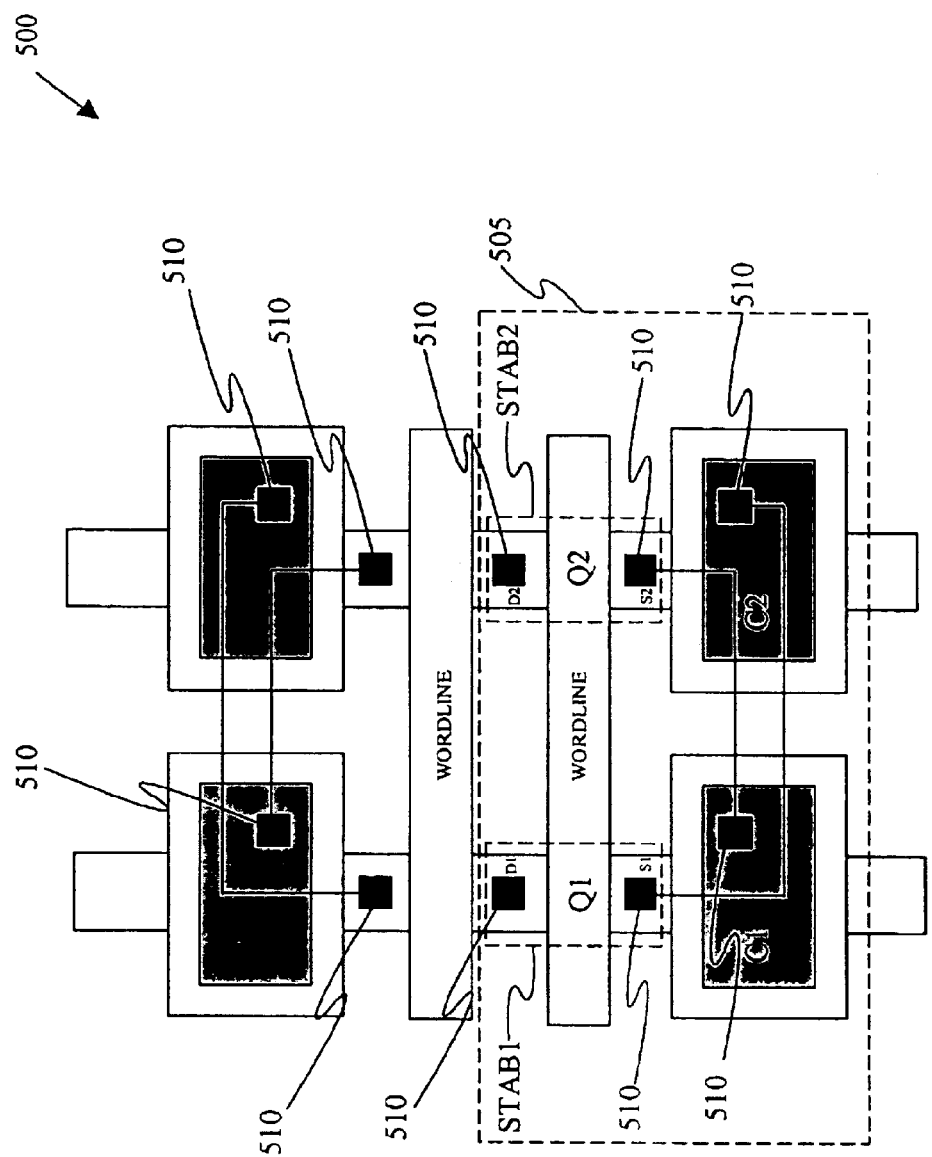
FIG. 5 illustrates a plan view of an embodiment of an integrated circuit representing a portion of an integrated EEPROM cell constructed in accordance with the principles of the present invention.

Turning now to FIG. 5, illustrated is a plan view of an embodiment of an integrated circuit representing a portion of an integrated EEPROM cell, generally designated 500, constructed in accordance with the principles of the present invention. The integrated circuit 500 includes an EEPROM memory cell 505, located on a semiconductor substrate (not shown), having first and second memory elements C1, C2 and first and second threshold stabilized MOS transistors Q1, Q2. The first and second threshold stabilized MOS transistors Q1, Q2 include first and second sources S1, S2 and first and second drains D1, D2, which are located in first and second body wells, respectively. Although not explicitly shown, the first and second threshold stabilized MOS transistors Q1, Q2 also include first and second gates and first and second backgates. The first and second backgates are respectively connected to the first and second body wells. Additionally, the first and second gates and backgates are connected together to form a WORDLINE for the EEPROM memory cell 505.

The first and second threshold stabilized MOS transistors Q1, Q2 have a body effect associated with them and further include first and second stabilization regions STAB1, STAB2, respectively. The first and second stabilization regions STAB1, STAB2 are positioned below the first and second body wells and form respective portions of first and second threshold voltage stabilizers, which provide a stabilization voltage to the first and second stabilization regions STAB1, STAB2. This stabilization voltage increases depletion regions within the first and second body wells thereby causing a restriction of their respective body effects, which substantially reduces variations in the respective threshold voltages associated with the first and second MOS transistors Q1, Q2. Various interconnects 510 between the MOS transistors, memory elements and the threshold voltage stabilizers form an operative integrated circuit.

In the illustrated embodiment, the threshold voltage stabilizers employ stabilization voltage sources that are internal to the integrated circuit 500 and form a portion of the memory cell 505. Additionally, each of the first and second stabilization regions STAB1, STAB2 further includes a contacting side stabilization region. Each of these side stabilization regions is adjacent to its respective body well and forms a stabilization ring about its body well. In alternative embodiments, a single stabilization region may be employed by a plurality of MOS transistors. Additionally, this single stabilization region may employ a single side stabilization region encompassing a plurality of MOS transistors or a plurality of side stabilization regions associated with one or more MOS transistors.

Figure 6:
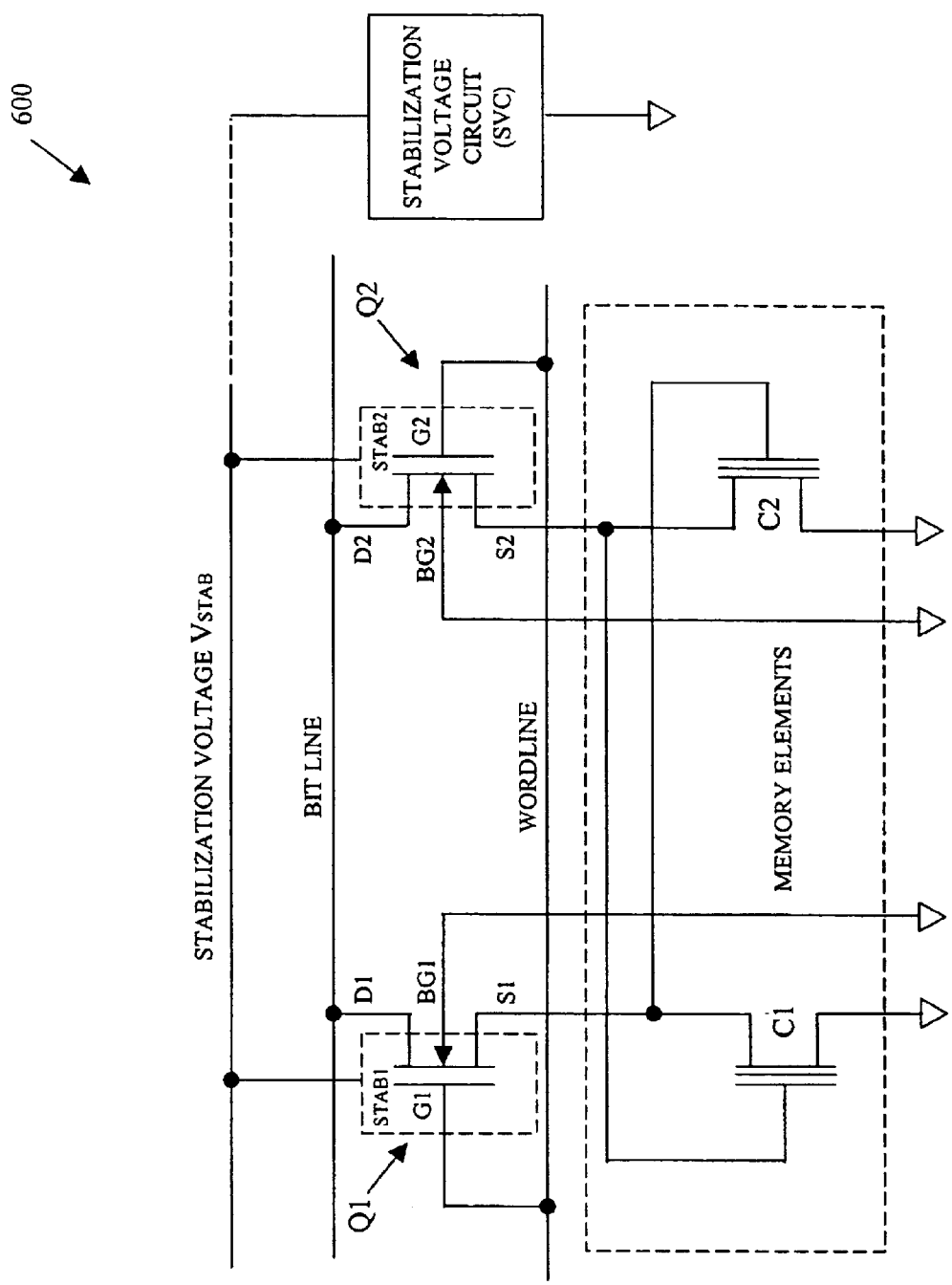
FIG. 6 illustrates a schematic representation of an embodiment of an EEPROM memory cell as shown in FIG. 5 and constructed in accordance with the principles of the present invention.

Turning now to FIG. 6, illustrated is a schematic representation of an embodiment of an EEPROM memory cell, generally designated 600, as shown in FIG. 5 and constructed in accordance with the principles of the present invention. The EEPROM memory cell 600 includes first and second memory elements C1, C2 and first and second threshold stabilized MOS transistors Q1, Q2 having first and second stabilization layers STAB1, STAB2, as shown. First and second gates Gc1, Gc2 of the first and second memory elements C1, C2 are cross coupled to the second and first threshold stabilized MOS transistors Q1, Q2, respectively. This cross coupling provides a switchable memory capability wherein only one of the first or second memory elements C1, C2 may sustain conduction after a "write" operation.

In the illustrated embodiment, first and second backgates BG1, BG2 are respectively connected to the first and second body wells of the first and second threshold stabilized MOS transistors Q1, Q2 and are not connected to first and second sources S1, S2. They are directly connected to first and second gates G1, G2 thereby forming a WORDLINE for the EEPROM memory cell 600. The WORDLINE voltage represents a backgate bias voltage that is applied to each of the body wells. As the WORDLINE voltage cycles, the backgate bias voltage changes, which would normally cause varying threshold voltage values associated with the first and second threshold stabilized MOS transistors Q1, Q2.

However, a stabilizing voltage VSTAB, restricts the body effect associated with a potential difference between a body well and a source. The stabilizing voltage VSTAB, which is provided by a stabilization voltage circuit SVC, is substantially independent of the backgate bias voltage and may be provided internally through a trace on the integrated circuit to first and second stabilization layers STAB1, STAB2. Additionally, the stabilization voltage circuit SVC may be the source of a variable voltage having a voltage value that is selectable and sufficient to stabilize the threshold voltages.

In summary, embodiments of the present invention employing a threshold voltage stabilizer and a method of manufacturing a threshold voltage stabilizer have been presented. The threshold voltage stabilizer may be employed to increase a depletion region within a body well thereby restricting the body effect associated with a MOS transistor. Restricting the body effect in this manner stabilizes the threshold voltage. The value of the stabilized threshold voltage may be constrained to be slightly greater than the minimum threshold voltage exhibited without body effect.

Although the present invention has been described in detail, those skilled in the art should understand that they can make various changes, substitutions and alterations herein without departing from the spirit and scope of the invention in its broadest form.

What is claimed is:

1. A threshold voltage stabilizer, for use with a MOS transistor having a body effect associated therewith, comprising:
    a body well located in a substrate;
    a source located in said body well; and
    a stabilization region, positioned below said body well, said threshold voltage stabilizer being configured to provide a stabilization voltage to said stabilization region to increase a depletion region within said body well and thereby restrict said body effect to stabilize a threshold voltage of said MOS transistor.

2. The threshold voltage stabilizer as recited in claim 1 wherein said depletion region limits an expansion of a channel depletion region within said body well.

3. The threshold voltage stabilizer as recited in claim 1 wherein said body well is not directly connected to said source.

4. The threshold voltage stabilizer as recited in claim 1 wherein said stabilization voltage is independent of a backgate bias voltage applied to said body well.

5. The threshold voltage stabilizer as recited in claim 1 wherein said stabilization region further includes a side stabilization region that contacts said stabilization region.

6. The threshold voltage stabilizer as recited in claim 5 wherein said side stabilization region is adjacent said body well and forms a stabilization ring about said body well.

7. The threshold voltage stabilizer as recited in claim 1 wherein said body well is doped with a first dopant and said stabilization region is doped with a second dopant opposite to said first dopant.

8. The threshold voltage stabilizer as recited in claim 7 wherein a concentration of said first dopant ranges from about 5 E15/cm$^3$ to 5 E16/cm$^3$ and a concentration of said second dopant ranges from about 5 E18/cm$^3$ to 2 E19/cm$^3$.

9. The threshold voltage stabilizer as recited in claim 1 wherein said stabilization voltage is provided by a variable voltage source configured to deliver a voltage sufficient to stabilize said threshold voltage.

10. A method of manufacturing a threshold voltage stabilizer for use with a MOS transistor having a body effect associated therewith, comprising:
    forming a body well in a substrate;
    forming a source in said body well;
    creating a stabilization region wherein at least a portion of said stabilization region is located below said body well; and
    configuring said threshold voltage stabilizer to provide a stabilization voltage to said stabilization region to increase a depletion region within said body well and thereby restrict said body effect to stabilize a threshold voltage of said MOS transistor.

11. The method as recited in claim 10 wherein said configuring said threshold voltage stabilizer allows said depletion region to limit an expansion of a channel depletion region within said body well.

12. The method as recited in claim 10 wherein forming said body well allows electrical isolation from said source.

13. The method as recited in claim 10 wherein said creating a stabilization region further includes creating a side stabilization region that contacts said stabilization region.

14. The method as recited in claim 13 wherein said side stabilization region is adjacent said body well and forms a stabilization ring about said body well.

15. The method as recited in claim 10 wherein said forming said body well includes doping said body well with a first dopant and said forming said stabilization region includes doping said stabilization region with a second dopant opposite to said first dopant.

16. The method as recited in claim 15 wherein a concentration of said first dopant ranges from about $5\ E15/cm^3$ to $5\ E16/cm^3$ and a concentration of said second dopant ranges from about $5\ E18/cm^3$ to $2\ E19/cm^3$.

17. The method as recited in claim 10 further including providing said stabilization voltage from a variable voltage source that delivers a voltage sufficient to stabilize said threshold voltage.

18. An integrated circuit, comprising:
   memory cells located on a semiconductor substrate;
   MOS transistors located on said semiconductor substrate, said transistors having a body effect associated therewith;
   threshold voltage stabilizers, for use with said transistors, located on said semiconductor substrate wherein each includes:
      a body well located in said semiconductor substrate;
      a source located in said body well; and
      a stabilization region, positioned below said body well, said threshold voltage stabilizer providing a stabilization voltage to said stabilization region to increase a depletion region within said body well and thereby restrict said body effect to stabilize a threshold voltage of said MOS transistor; and
   interconnects interconnecting said memory cells, said MOS transistors and said threshold voltage stabilizers to form an operative integrated circuit.

19. The integrated circuit as recited in claim 18 wherein said depletion region limits an expansion of a channel depletion region within said body well.

20. The integrated circuit as recited in claim 18 wherein said body well is not directly connected to said source.

21. The integrated circuit as recited in claim 18 wherein said stabilization voltage is substantially independent of a backgate bias voltage applied to said body well.

22. The integrated circuit as recited in claim 18 wherein said stabilization region further includes a side stabilization region that contacts said stabilization region.

23. The integrated circuit as recited in claim 22 wherein said side stabilization region is adjacent said body well and forms a stabilization ring about said body well.

24. The integrated circuit as recited in claim 18 wherein said stabilization voltage is provided by a variable voltage source that delivers a voltage sufficient to stabilize said threshold voltage.

25. The integrated circuit as recited in claim 18 wherein said threshold voltage stabilizers form a portion of said memory cells.

* * * * *